United States Patent
Hsiao et al.

(10) Patent No.: US 11,251,262 B2
(45) Date of Patent: Feb. 15, 2022

(54) CAPACITOR AND MANUFACTURING METHOD THEREOF

(71) Applicant: Winbond Electronics Corp., Taichung (TW)

(72) Inventors: Yu-Ping Hsiao, Taichung (TW); Wei-Chao Chou, Taichung (TW); Ming-Tang Chen, Taichung (TW); Cheol Soo Park, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/031,936

(22) Filed: Sep. 25, 2020

(65) Prior Publication Data
US 2021/0151554 A1 May 20, 2021

(30) Foreign Application Priority Data
Nov. 19, 2019 (TW) ................................. 108141911

(51) Int. Cl.
*H01L 49/02* (2006.01)
*H01L 21/311* (2006.01)
*H01L 21/3213* (2006.01)
*H01L 21/3065* (2006.01)

(52) U.S. Cl.
CPC .......... *H01L 28/92* (2013.01); *H01L 21/3065* (2013.01); *H01L 21/31116* (2013.01); *H01L 21/3213* (2013.01); *H01L 21/32139* (2013.01)

(58) Field of Classification Search
CPC ................. H01L 28/92; H01L 21/3065; H01L 21/31116; H01L 21/3213; H01L 21/32139
See application file for complete search history.

(56) References Cited

U.S. PATENT DOCUMENTS

| | | | |
|---|---|---|---|
| 8,058,678 B2 | 11/2011 | Kim et al. | |
| 10,566,415 B2* | 2/2020 | Park | H01L 28/87 |
| 10,998,318 B2* | 5/2021 | Choo | H01L 27/10805 |
| 2006/0275997 A1* | 12/2006 | Ikeda | H01L 28/91 |
| | | | 438/396 |
| 2016/0365409 A1* | 12/2016 | Lee | H01L 28/90 |

FOREIGN PATENT DOCUMENTS

TW 201904077 1/2019

* cited by examiner

*Primary Examiner* — Anita K Alanko
(74) *Attorney, Agent, or Firm* — JCIPRNET

(57) ABSTRACT

A capacitor and a manufacturing method thereof are provided. The capacitor includes a cup-shaped lower electrode, a capacitive dielectric layer, an upper electrode, and a support layer. The support layer includes an upper support layer surrounding an upper portion of the cup-shaped lower electrode, a middle support layer surrounding a middle portion of the cup-shaped lower electrode, and a lower support layer surrounding a lower portion of the cup-shaped lower electrode. Surfaces of the upper support layer, the middle support layer, and the lower support layer are covered by the capacitive dielectric layer.

6 Claims, 17 Drawing Sheets

CAPACITOR AND MANUFACTURING METHOD THEREOF

CROSS-REFERENCE TO RELATED APPLICATION

This application claims the priority benefit of Taiwan application serial no. 108141911, filed on Nov. 19, 2019. The entirety of the above-mentioned patent application is hereby incorporated by reference herein and made a part of this specification.

BACKGROUND

Technical Field

The disclosure relates to a semiconductor structure and a manufacturing method thereof, and in particular, to a capacitor and a manufacturing method thereof.

Description of Related Art

A dynamic random access memory is a volatile memory and includes a plurality of memory cells. In particular, each memory cell is mainly formed by a transistor and a capacitor controlled by the transistor. The capacitor is mainly configured to store charges representing data, and needs to be provided with a high capacitance to ensure that data is not easily lost.

With the development of science and technology, various electronic products are designed to be light, thin, and small with a high speed and high efficiency. However, under the trend, a demand for a dynamic random access memory with higher capacity is accordingly increased. Therefore, the dynamic random access memory is also designed toward high integration and high density. However, the memory cells on the dynamic random access memory with high integration are usually arranged closely, making it almost impossible to increase the area of the capacitor in a lateral direction.

SUMMARY

The disclosure provides a capacitor, and an area and a capacitance of the capacitor are increased by increasing the height in a vertical direction.

The disclosure provides a capacitor, and the capacitor is supported by a plurality of support layers to reinforce mechanical strength of the capacitor.

The disclosure provides a method for manufacturing a capacitor. When a cup-shaped lower electrode is formed, an additional photomask is not required, and nor is a chemical mechanical polishing process, and mold stripping may be performed without a photomask. Therefore, the manufacturing process can be simplified, and the manufacturing costs can be reduced.

The disclosure provides a capacitor including a cup-shaped lower electrode, a capacitive dielectric layer, an upper electrode, and a support layer. The support layer includes: an upper support layer surrounding an upper portion of the cup-shaped lower electrode; a middle support layer surrounding a middle portion of the cup-shaped lower electrode; and a lower support layer surrounding a lower portion of the cup-shaped lower electrode. Surfaces of the upper support layer, the middle support layer, and the lower support layer are covered by the capacitive dielectric layer.

The disclosure provides a method for manufacturing a capacitor, including the following steps: sequentially forming a template layer and an upper support layer on a substrate; forming a first opening in the upper support layer and the template layer; forming a conductor layer on the substrate to cover the first opening and the upper support layer; forming a first mask layer on the substrate, the first mask layer having an overhang, covering an upper side wall of the first opening, and closing up a top end of the first opening; etching back the first mask layer to expose the conductor layer on the upper support layer; removing the conductor layer on the upper support layer to form a plurality of cup-shaped lower electrodes; etching back a portion of the upper support layer, so that a top end of the cup-shaped lower electrode protrudes from a top surface of the upper support layer; removing the first mask layer; forming a protective layer on the substrate; forming a second opening in the protective layer to expose the upper support layer; removing a portion of the upper support layer and a portion of the template layer below the second opening to form a third opening; performing mold stripping to remove the protective layer and the template layer to expose an inner surface and an outer surface of the cup-shaped lower electrode; forming a capacitive dielectric layer on the inner surface and the outer surface of the cup-shaped lower electrode and a surface of the upper support layer; and forming an upper electrode on a surface of the capacitive dielectric layer.

Based on the above, in the disclosure, the mechanical strength of the capacitor is enhanced by using a reinforcement structure formed by a lower support layer, a middle support layer, and an upper support layer, to prevent the capacitor from being deformed or even collapsing. In addition, when the cup-shaped lower electrode is formed, a mask layer with the overhang may be used as an etch mask. In this way, not only a lithography process can be omitted, but the to-be-etched regions can be aligned accordingly, so that the accuracy of alignment can be increased. Moreover, when the cup-shaped lower electrode is formed, a chemical mechanical polishing process can be omitted, and therefore the manufacturing process can be simplified, and the manufacturing costs can be reduced.

BRIEF DESCRIPTION OF THE DRAWINGS

FIG. 3A and FIG. 3C to FIG. 3H are schematic cross-sectional views respectively taken along lines II-IP in FIG. 1C to FIG. 1I.

DESCRIPTION OF THE EMBODIMENTS

Figure 1A:
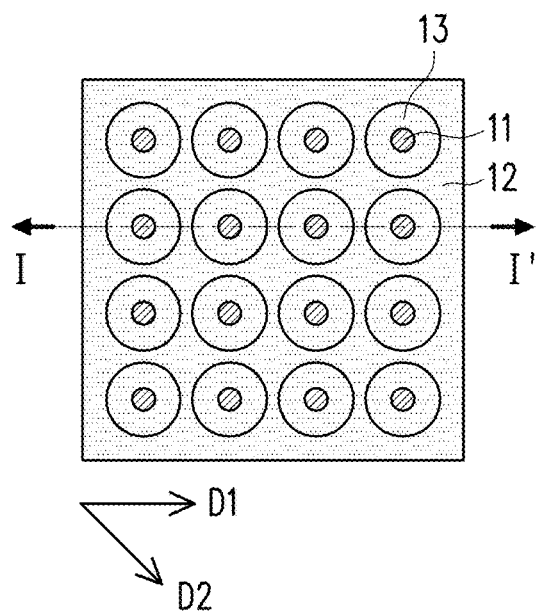
FIG. 1A to FIG. 1K are each a schematic top view of a manufacturing process of a capacitor according to an embodiment of the disclosure.
Figure 2A:
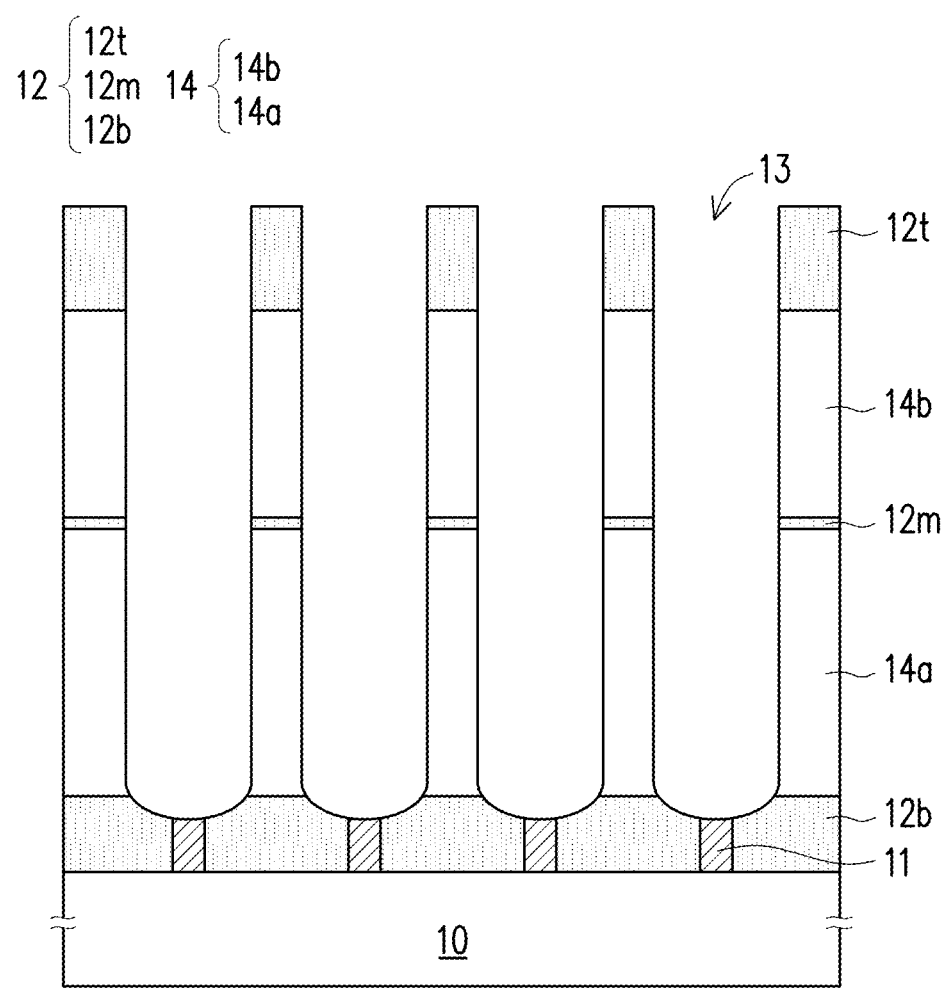
FIG. 2A to FIG. 2F are schematic cross-sectional views respectively taken along lines I-I' in FIG. 1A to FIG. 1C and FIG. 1I to FIG. 1K.

Referring to FIG. 1A and FIG. 2A together, the present embodiment provides a method for manufacturing a capacitor, including the following steps. First, a substrate 10 is provided. The substrate 10 is, for example, a semiconductor substrate, a semiconductor compound substrate, or a silicon-on-insulator (SOI) substrate. A plurality of capacitor contact windows 11 are formed on the substrate 10. The capacitor contact window 11 is made of a conductive material, which may be, for example, polysilicon, a metal material (such as tungsten), a metal silicide, or a combination thereof.

Next, a support layer 12b, a template layer 14a, a support layer 12m, a template layer 14b, and a support layer 12t are sequentially formed on the substrate 10. The support layer 12b, the support layer 12m, and the support layer 12t are also referred to as a lower support layer 12b, a middle support layer 12m, and an upper support layer 12t, respectively. Support layers 12 (12b, 12m, 12t) may be made of, for example, silicon nitride, silicon oxynitride, silicon carbonitride, silicon carbide, or a combination thereof. The template layer 14a and the template layer 14b are also referred to as a lower template layer 14a and an upper template layer 14b, respectively. There may be one or more template layers 14 (14a, 14b), which may be made of, for example, silicon oxide, boron-phosphorosilicate glass, silicon nitride, or a combination thereof. Next, openings 13 exposing the capacitor contact window 11 are formed in the support layer 12 and the template layer 14 using a lithography and etching process. The openings 13 may be arranged in an array.

Figure 1B:
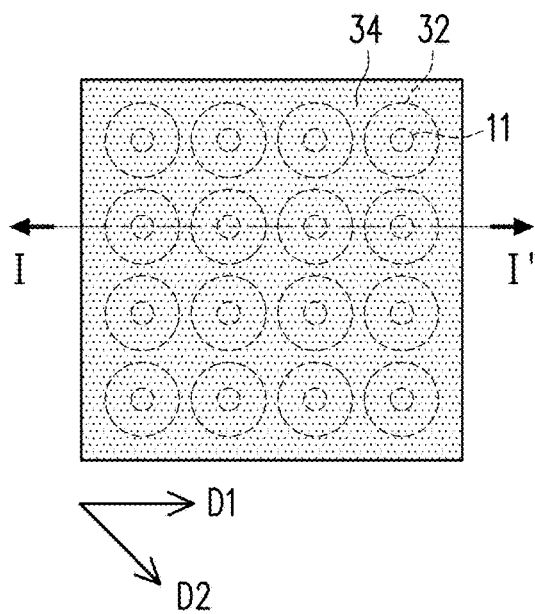
Figure 2B:
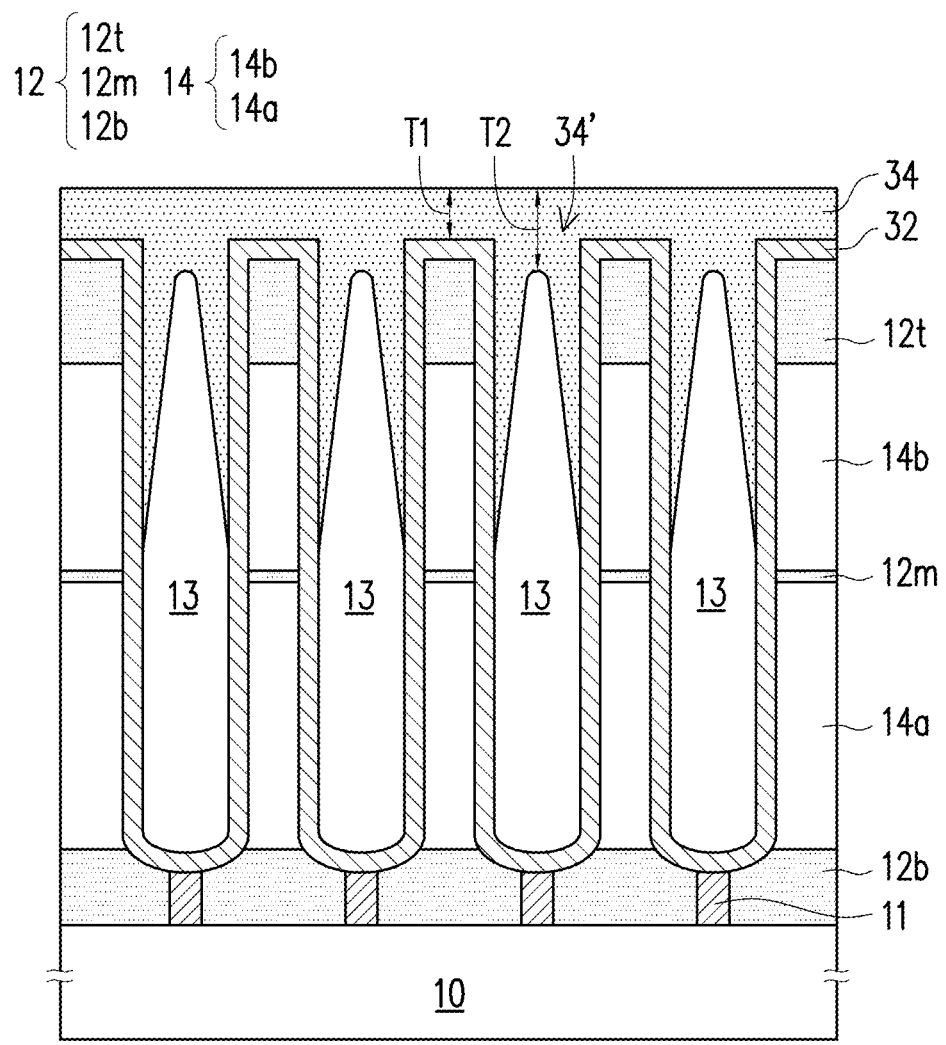

Referring to FIG. 1B and FIG. 2B, a conductor layer 32 and a mask layer 34 are formed on a substrate 10. The conductor layer 32 is, for example, a conformal layer, which may be made of, for example, titanium nitride, tantalum nitride, tungsten, titanium tungsten, aluminum, copper, or metal silicide. The mask layer 34 includes a dielectric layer, such as silicon oxide. Since a size of the opening 13 is quite small, and the mask layer 34 has poor step coverage, an upper side wall of the opening 13 is covered by the mask layer 34, and a top end of the opening 13 is closed up by an overhang 34' of the mask layer 34 without filling the opening 13. In some embodiments, a thickness T1 of the mask layer 34 on the support layer 12t is less than a thickness T2 of the mask layer 34 on the opening 13.

Figure 1C:
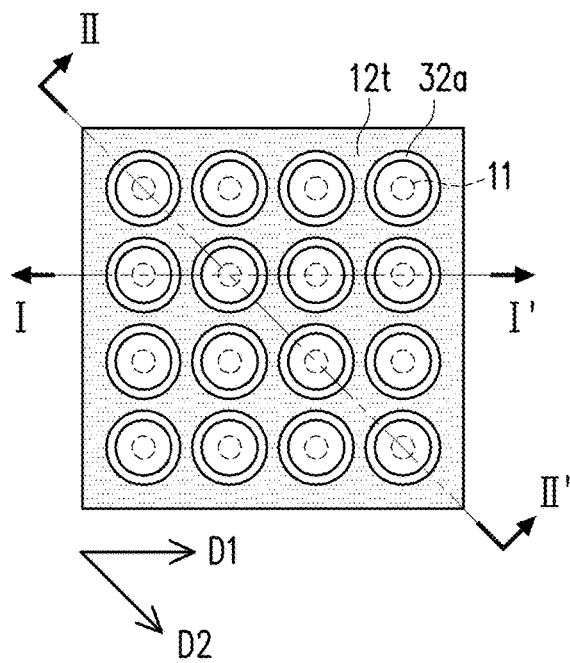
Figure 1E:
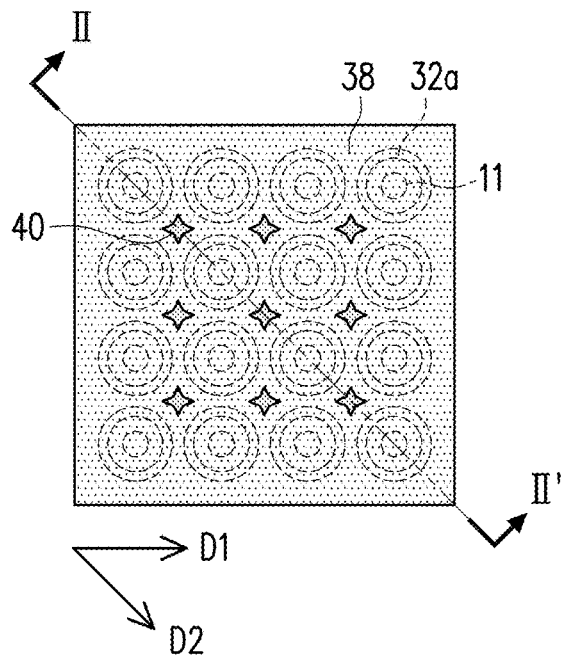
Figure 2C:
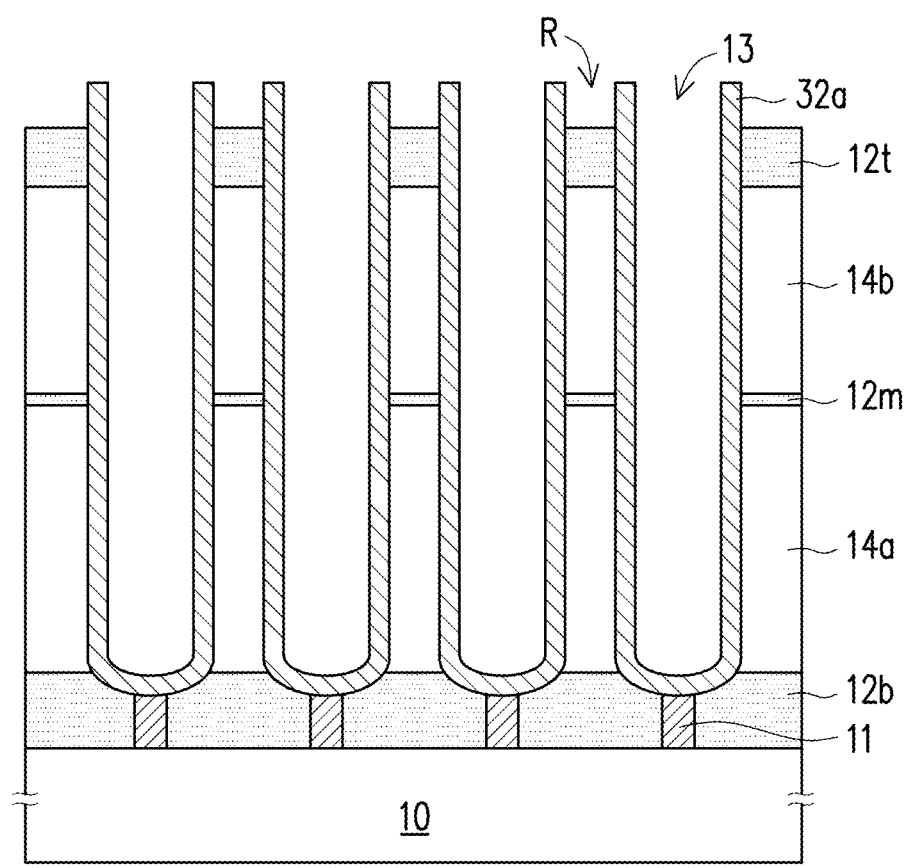
Figure 3A:
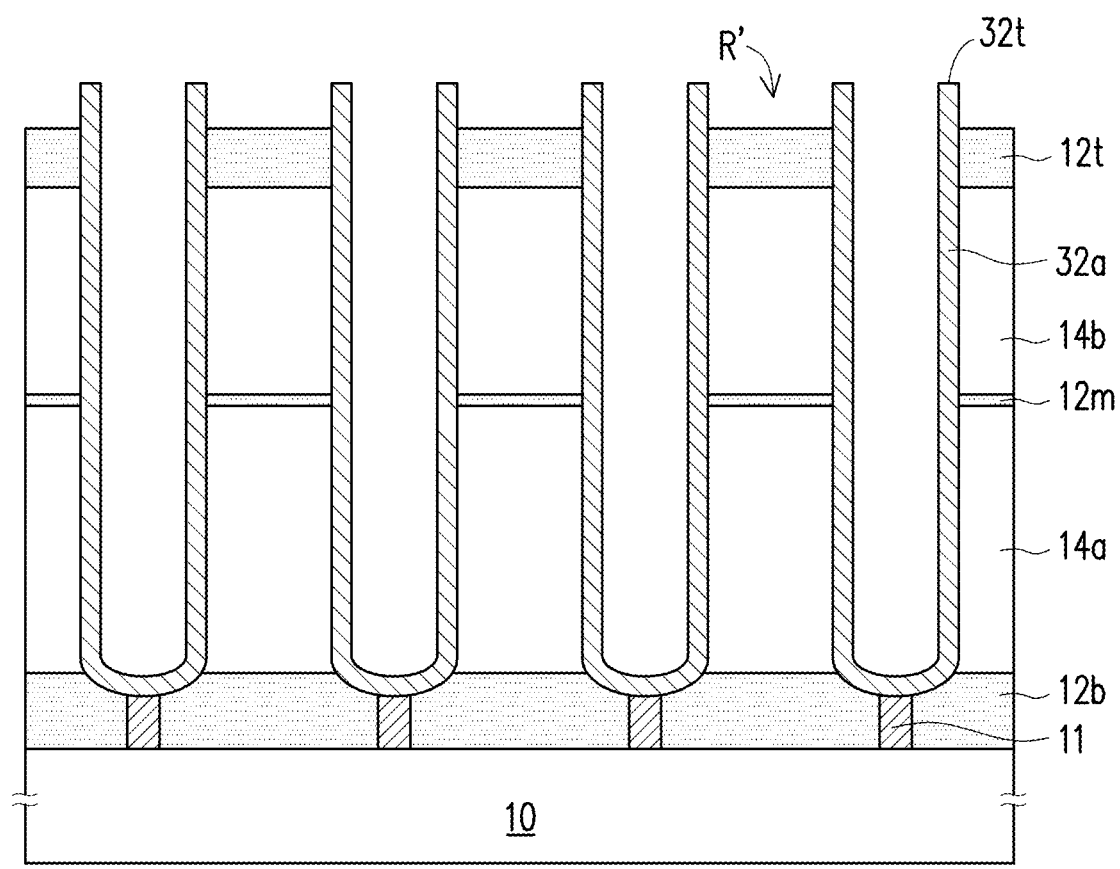
FIG. 3A to FIG. 3H are each a schematic cross-sectional view of a manufacturing process of a capacitor according to an embodiment of the disclosure.

Referring to FIG. 1C, FIG. 2C, and FIG. 3A, the mask layer 34 is etched back. Since a thickness T1 of the mask layer 34 on the support layer 12t is relatively small, a conductor layer 32 is first exposed during the etching process, and a top end of an opening 13 is still covered by the mask layer 34, so that the mask layer 34 may protect the conductor layer 32 in the openings 13. Next, the conductor layer 32 above the support layer 12t and the upper support layer 12t below the support layer are etched to form grooves R and R' in a first direction D1 and a second direction D2, respectively. This process does not require a lithographic process, and the openings 13 may be formed through aligned etching. Therefore, this process may also be referred to as a self-aligned etching process. Then, the remaining mask layer 34 is removed. A size of the groove R' in the second direction D2 is larger than a size of the groove R in the first direction D1. In the subsequent process, an opening 40 may be formed in the groove R' for mold stripping (FIG. 1E).

After the foregoing etching process is performed, a plurality of cup-shaped lower electrodes 32a that is separated from each other is formed in the openings 13. A top-view shape of the cup-shaped lower electrode 32a is, for example, circular, oval, or polygonal, a cross-sectional shape is, for example, U-shaped, and an upper portion 32t of the cup-shaped lower electrode 32a protrudes from the support layer 12t. In the disclosure, when the cup-shaped lower electrode 32a is formed, neither an additional photomask nor a chemical mechanical polishing process is required, and therefore a manufacturing process may be simplified, and manufacturing costs may be reduced.

Figure 3B:
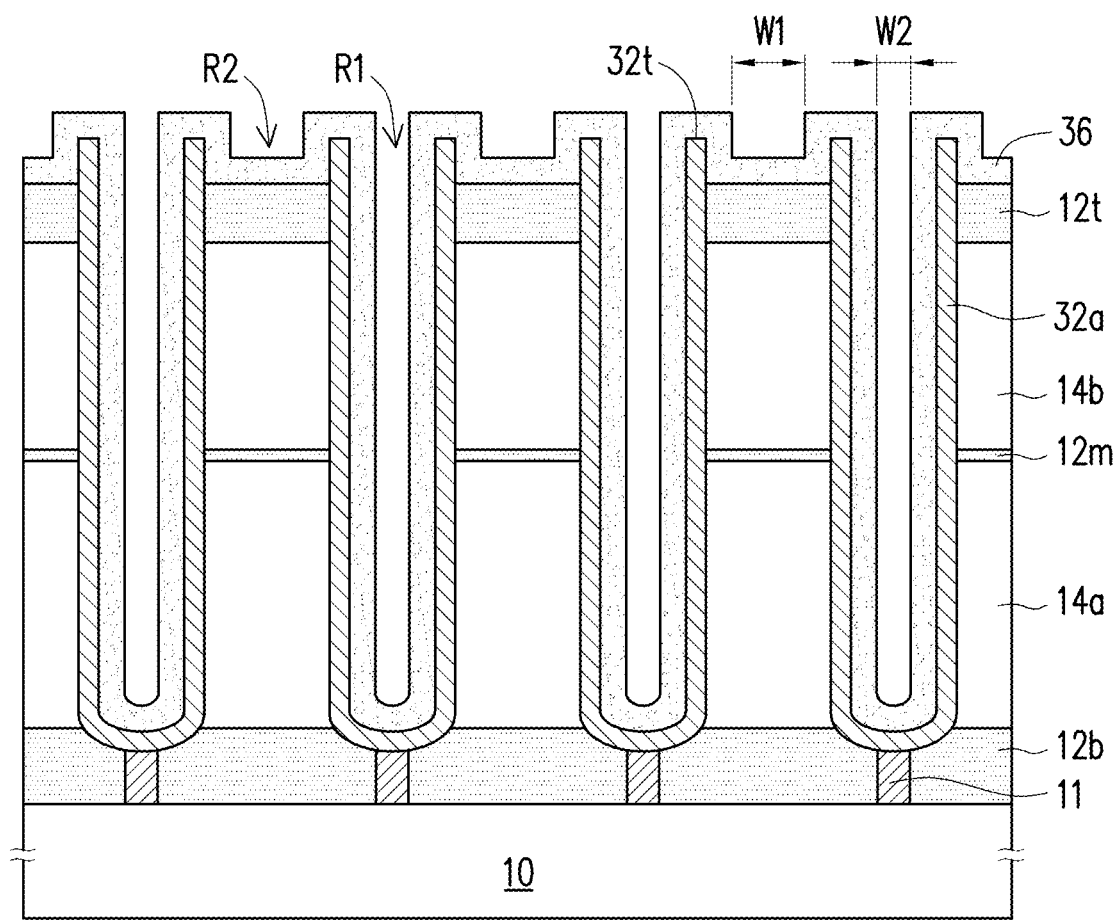

Referring to FIG. 3B, a protective layer 36 is formed on a substrate 10. The protective layer 36 includes a dielectric layer, such as a conformal layer formed using an atomic layer deposition method, which is selected from a material of a mask layer 38 with a high selection ratio, for example, a material with a selection ratio of 1:50 during dry etching and a selection ratio of 5:1 during wet etching. The protective layer 36 covers the cup-shaped lower electrode 32a and the support layer 12t in an opening 13. The protective layer 36 in the opening 13 has a groove R1. The protective layer 36 on the support layer 12t on the groove R' has a groove R2. A width W1 of the groove R1 is less than a width W2 of the groove R2.

Figure 1D:
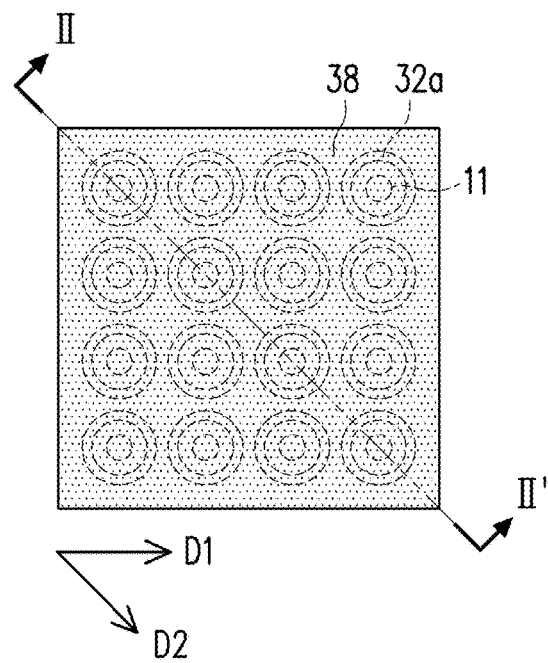
Figure 3C:
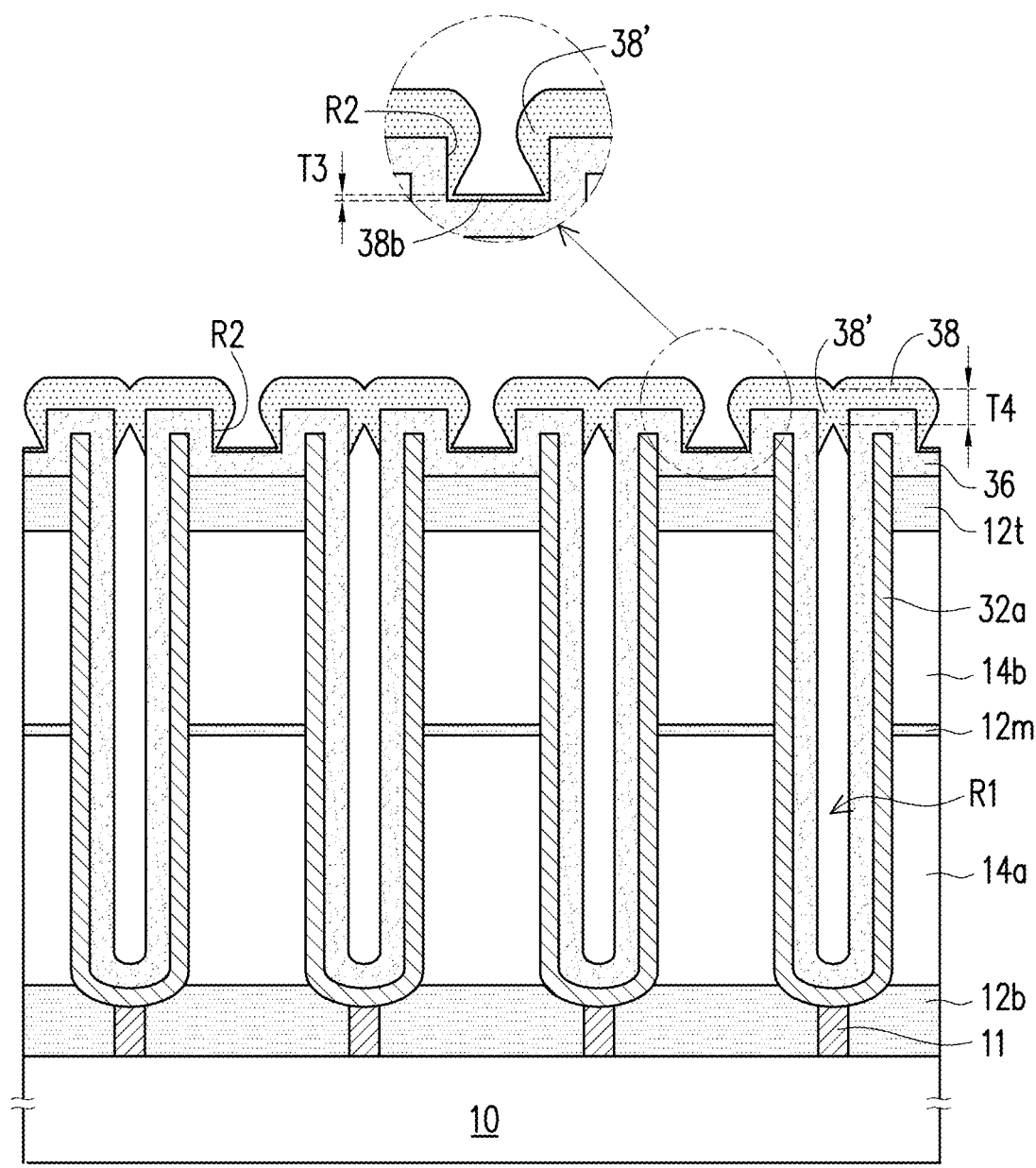

Referring to FIG. 1D and FIG. 3C, a mask layer 38 is formed on a substrate 10. The mask layer 38 includes a dielectric layer, such as silicon oxide. The mask layer 38 may be formed using a deposition method with poor step coverage, for example, formed through an enhanced chemical vapor deposition method using tetraethyl orthosilicate (TEOS) as reaction gas. Since the width W1 of the groove R1 in the cup-shaped lower electrode 32a is small and the step coverage of the mask layer 38 is poor, a lower side wall and the bottom of the groove R1 are not covered by the mask layer 38, an upper side wall of the groove R1 is covered by the mask layer 38, and overhangs 38' of the mask layer 38 at a top end of the groove R1 are connected to each other, thereby closing up the groove R1. Since the width W2 of the groove R2 is large, the overhangs 38' on a top end of the groove R2 are separated from each other, and a mask layer 38b on a bottom surface of the groove R2 is exposed. In addition, due to the poor step coverage of the mask layer 38, a thickness T3 of the mask layer 38b on the bottom surface of the groove R2 is less than a thickness T4 of the overhang 38' on the groove R1.

Figure 3D:
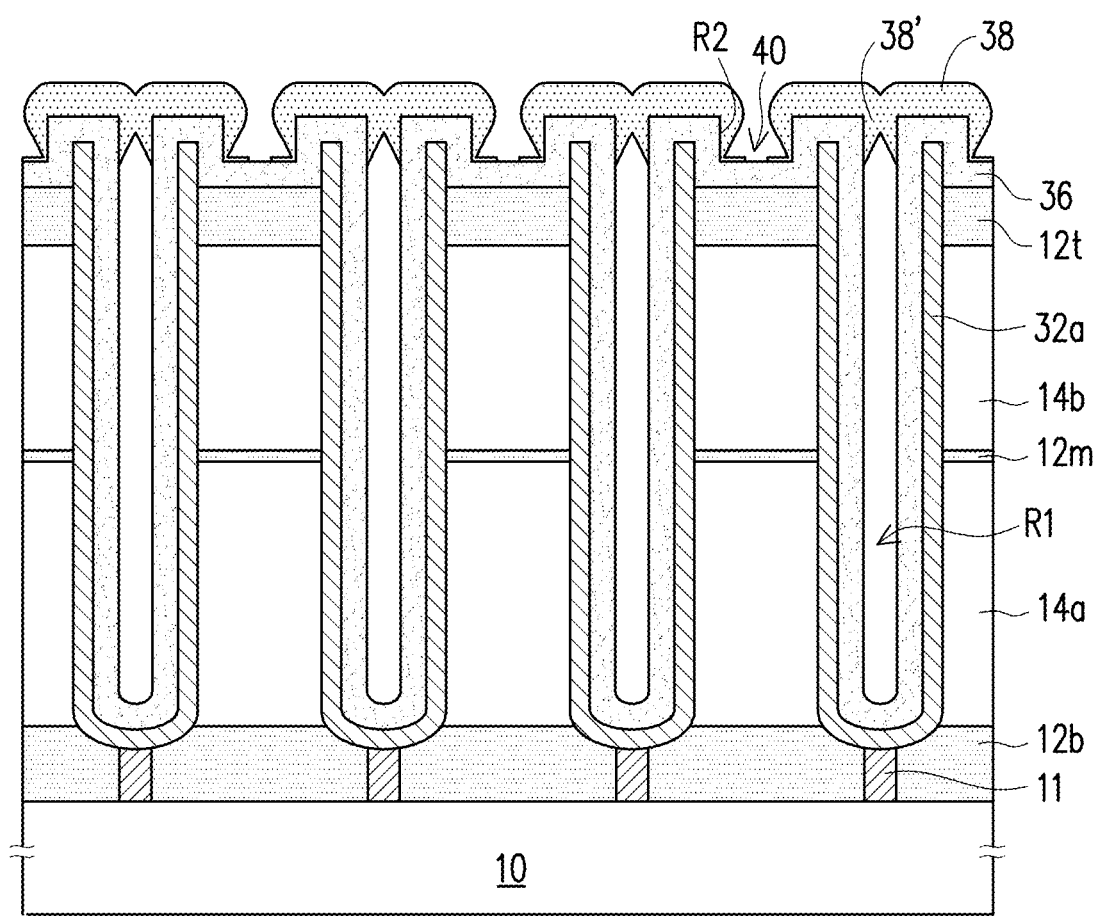

Referring to FIG. 1E and FIG. 3D, an etching process is performed on the mask layer 38, for example, a wet etching process. Since the thickness T3 of the mask layer 38b on the bottom surface of the groove R2 is relatively small, during the etching process, the mask layer is first etched to form an opening 40. The opening 40 exposes a portion of the protective layer 36 between four adjacent cup-shaped lower electrodes 32a. Although the overhang 38' on the groove R1 is also etched, since a thickness T4 of the overhang is relatively large, during the etching process, the protective layer 36 on a side wall and the bottom of the groove R1 may be protected, thereby protecting the cup-shaped lower electrodes 32a.

Figure 1F:
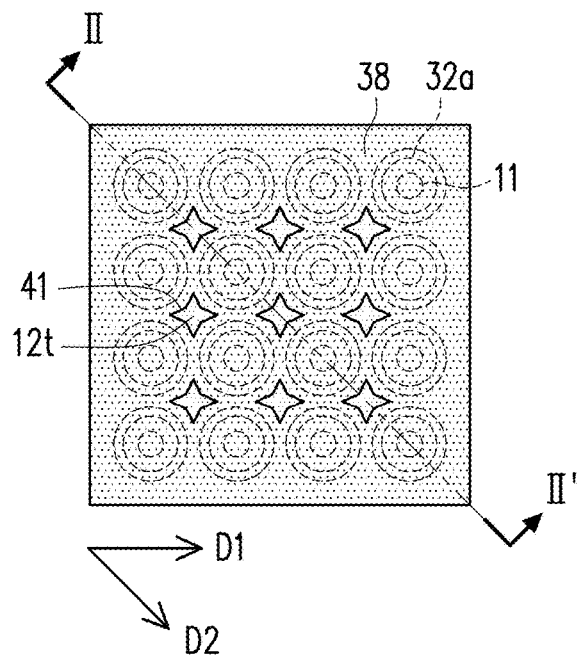
Figure 3E:
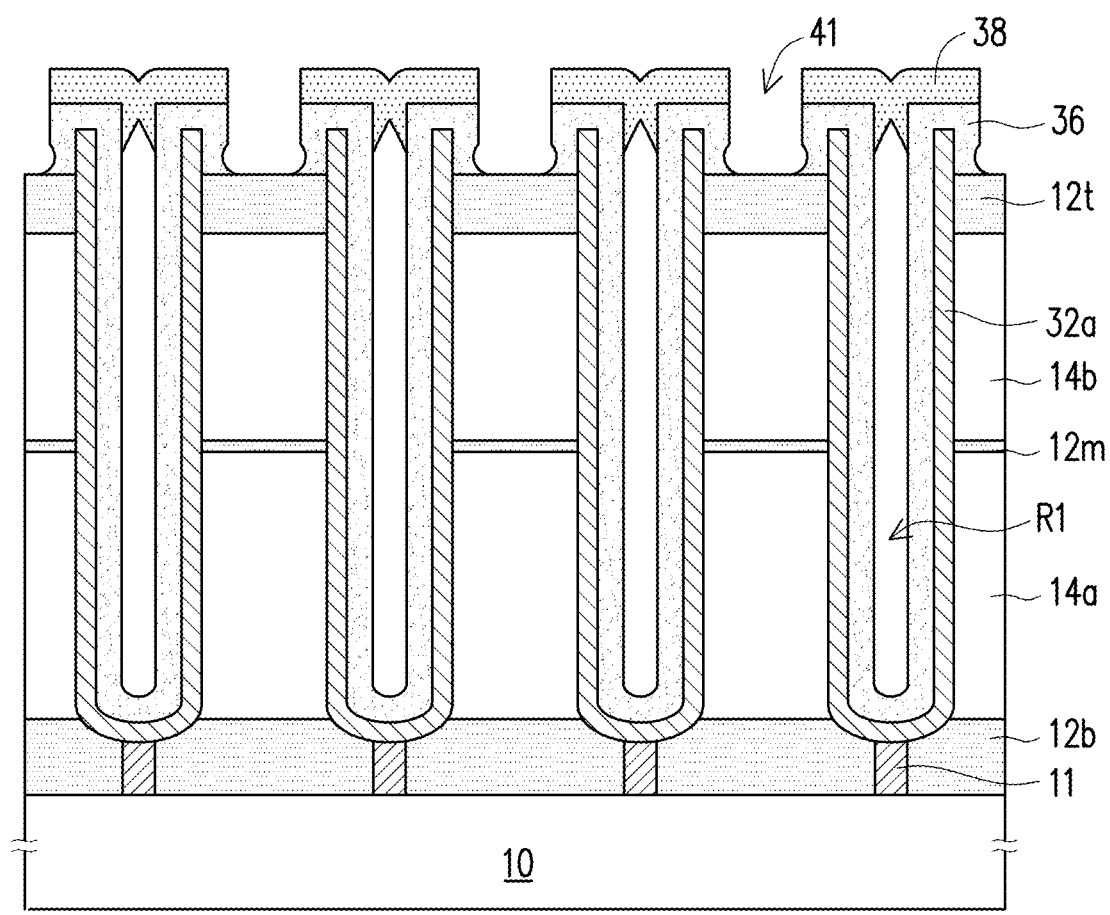

Referring to FIG. 1F and FIG. 3E, the mask layer 38 is used as a mask to perform an etching process (such as a reactive ion etching process). The protective layer 36 exposed by the opening 40 is etched in a one shot punch manner, to form an opening 41 that exposes the support layer 12t.

Figure 1G:
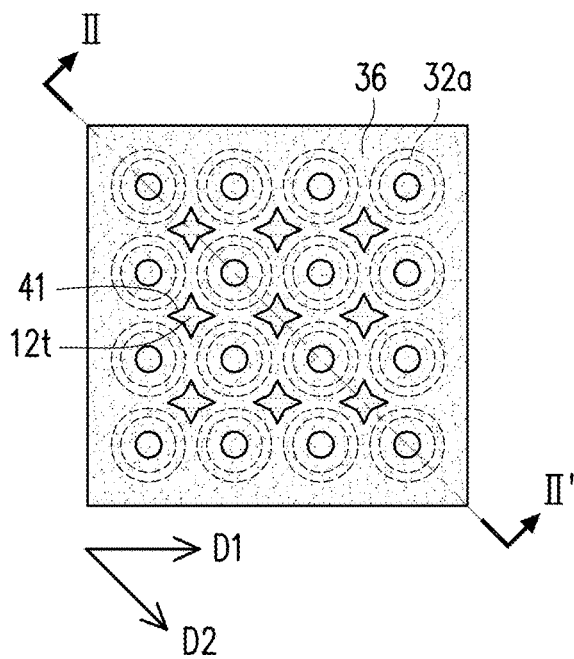
Figure 3F:
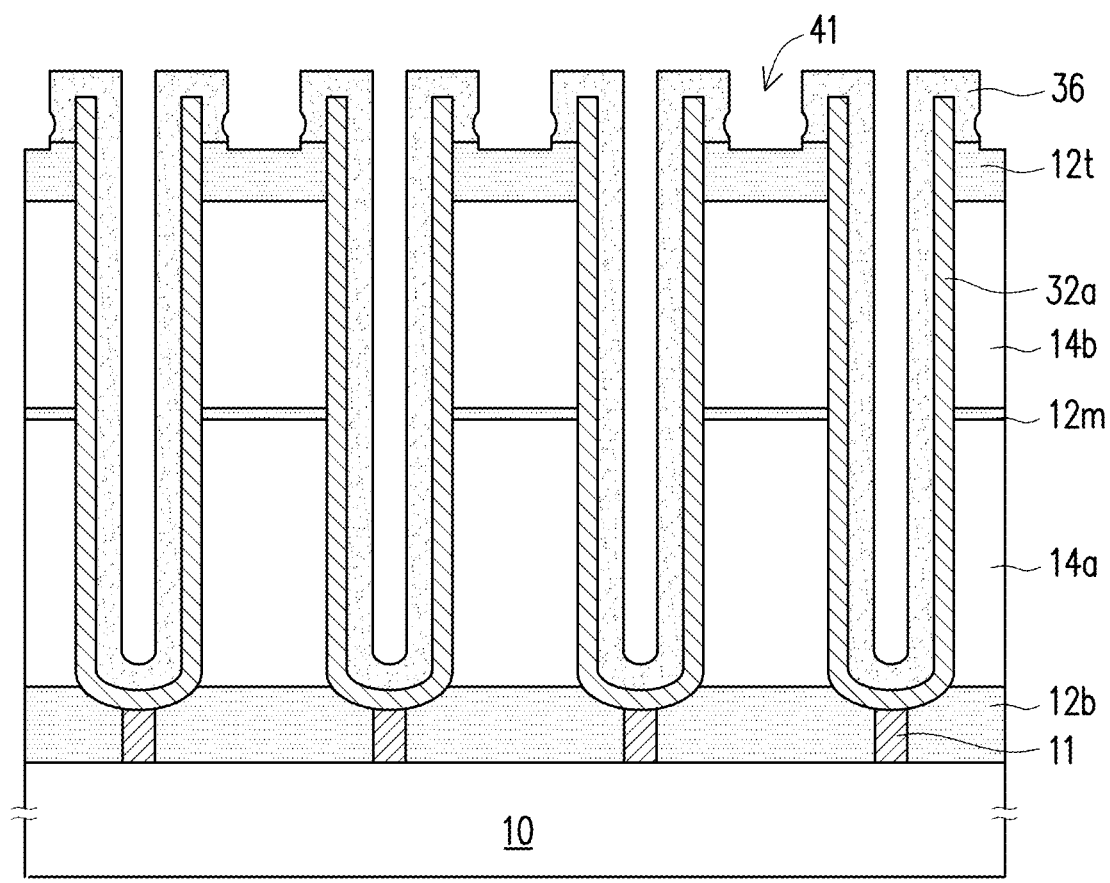

Referring to FIG. 1G and FIG. 3F, an etching process (such as a reactive ion etching process) is performed, to remove the mask layer 38 and expose the protective layer 36 between the plurality of cup-shaped lower electrodes 32a.

Figure 1H:
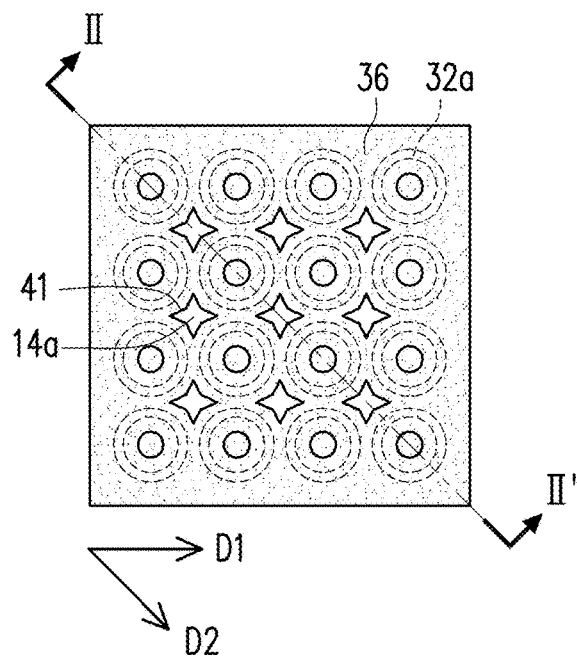
Figure 3G:
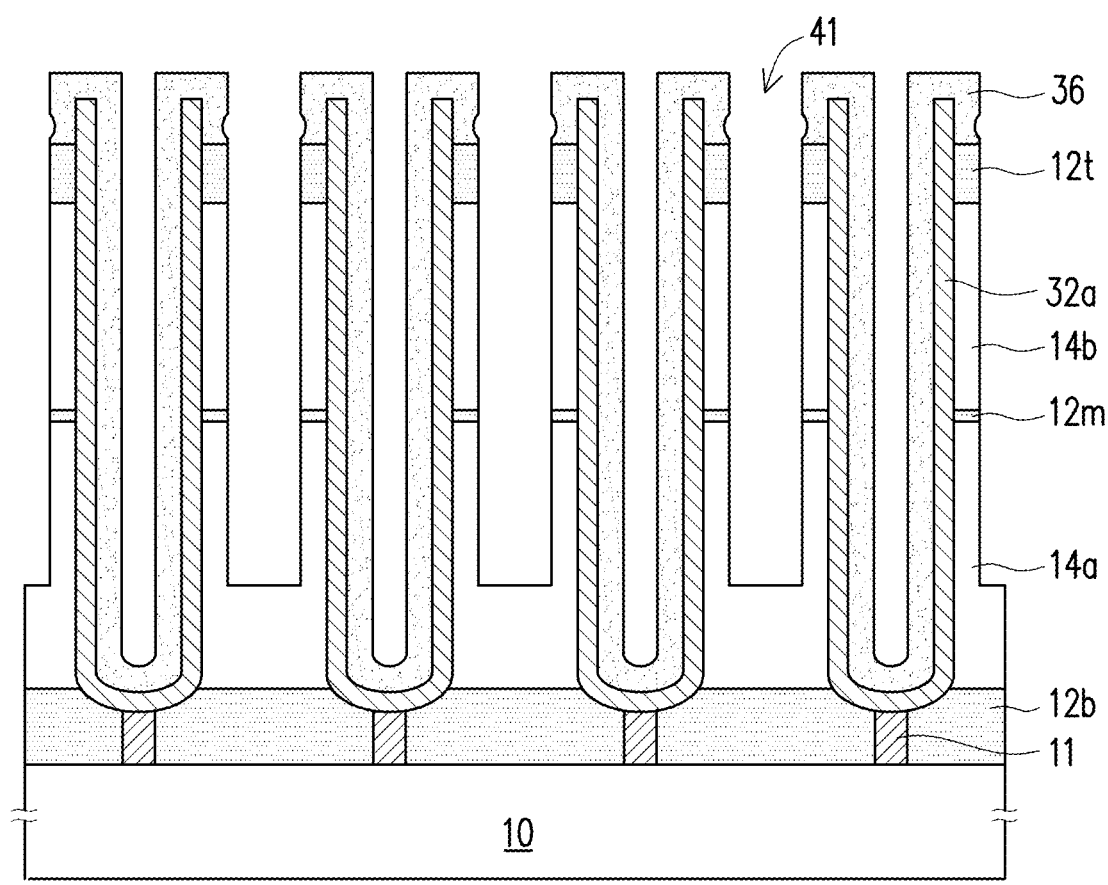

Referring to FIG. 1H and FIG. 3G, the protective layer 36 is used as a mask to perform an etching process (such as a reactive ion etching process). A portion of the support layer 12t, the template layer 14b, the support layer 12m, and the template layer 14a between the plurality of cup-shaped lower electrodes 32a are removed in a one shot punch manner, to form an opening 42. The process does not require an additional photomask or a lithography process, and therefore, in the present embodiment, the manufacturing process may be simplified, and manufacturing costs may be reduced.

Figure 1I:
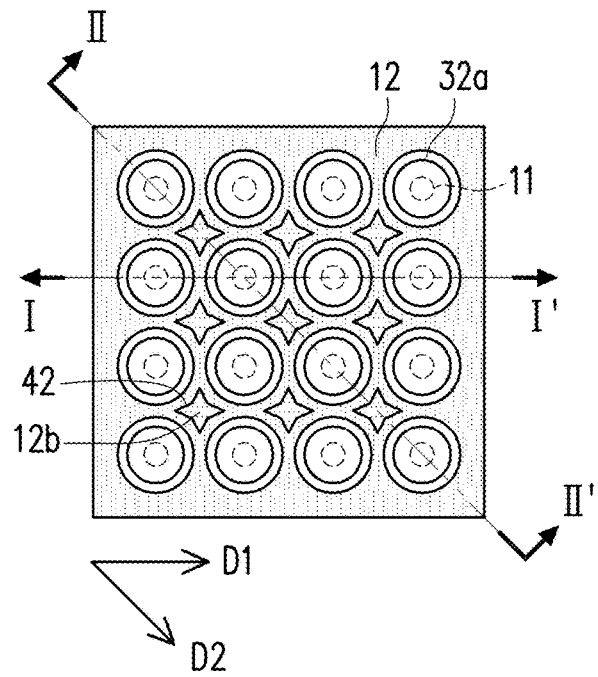
Figure 1J:
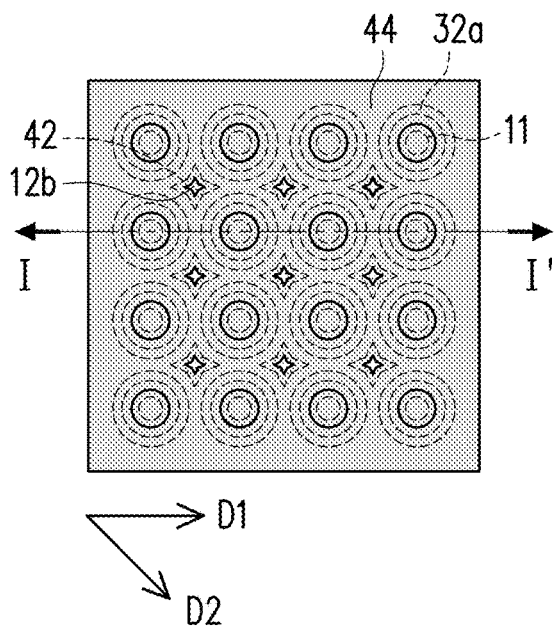
Figure 1K:
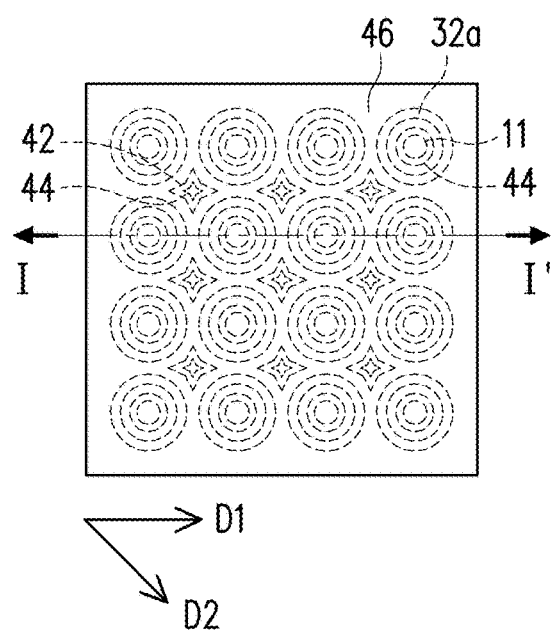
Figure 2D:
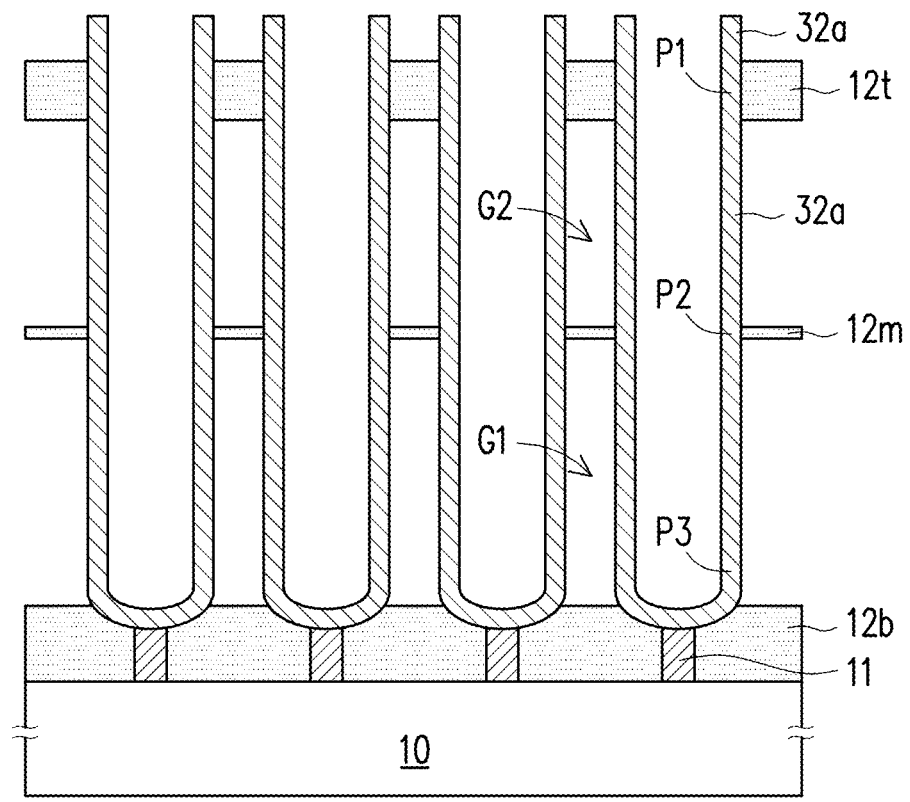
Figure 2E:
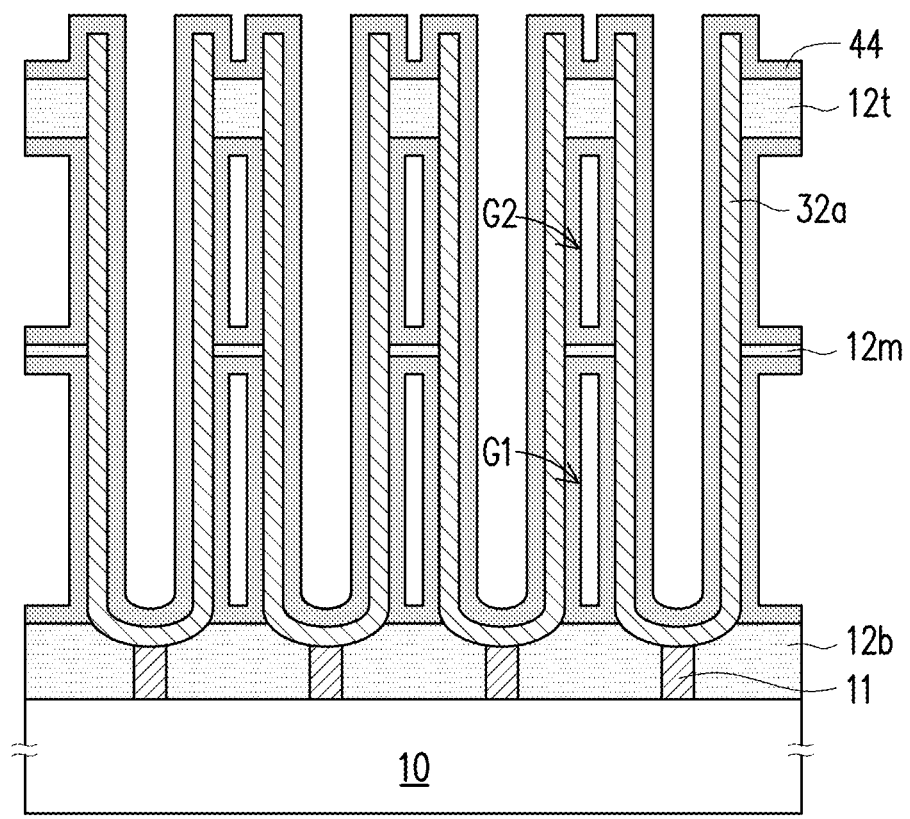
Figure 2F:
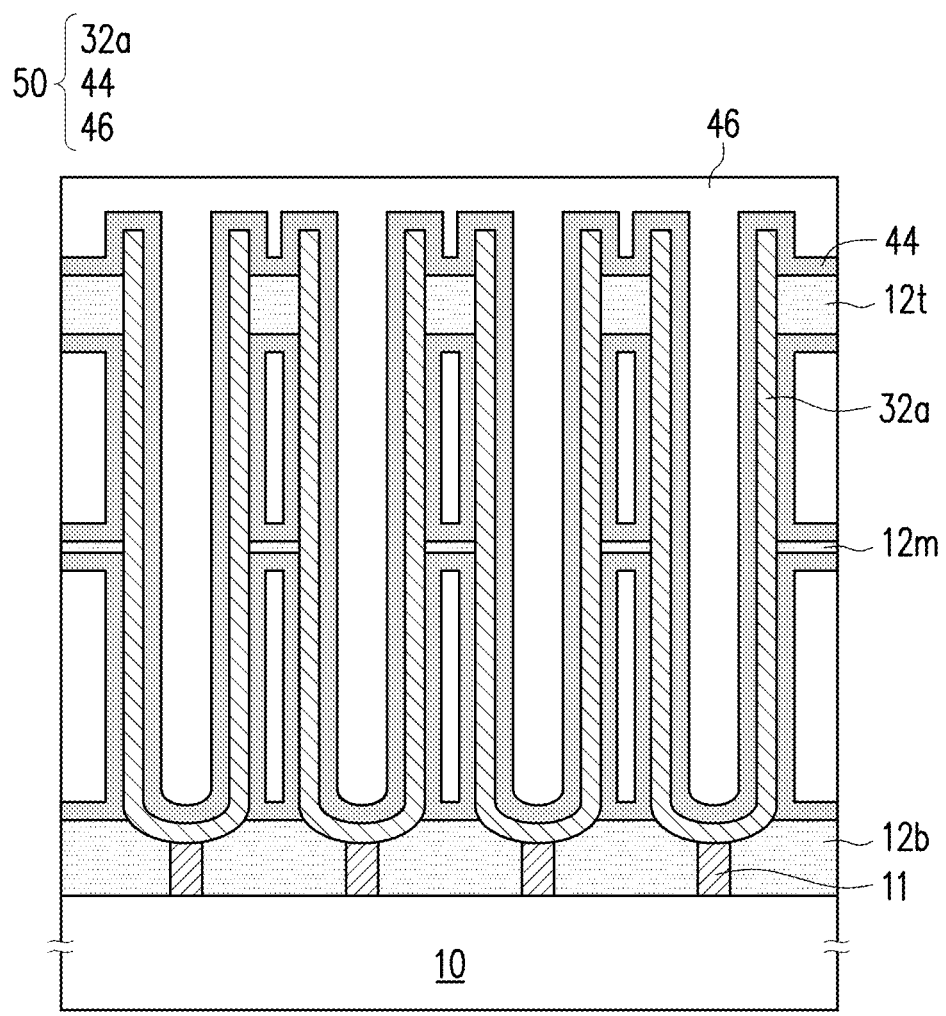
Figure 3H:
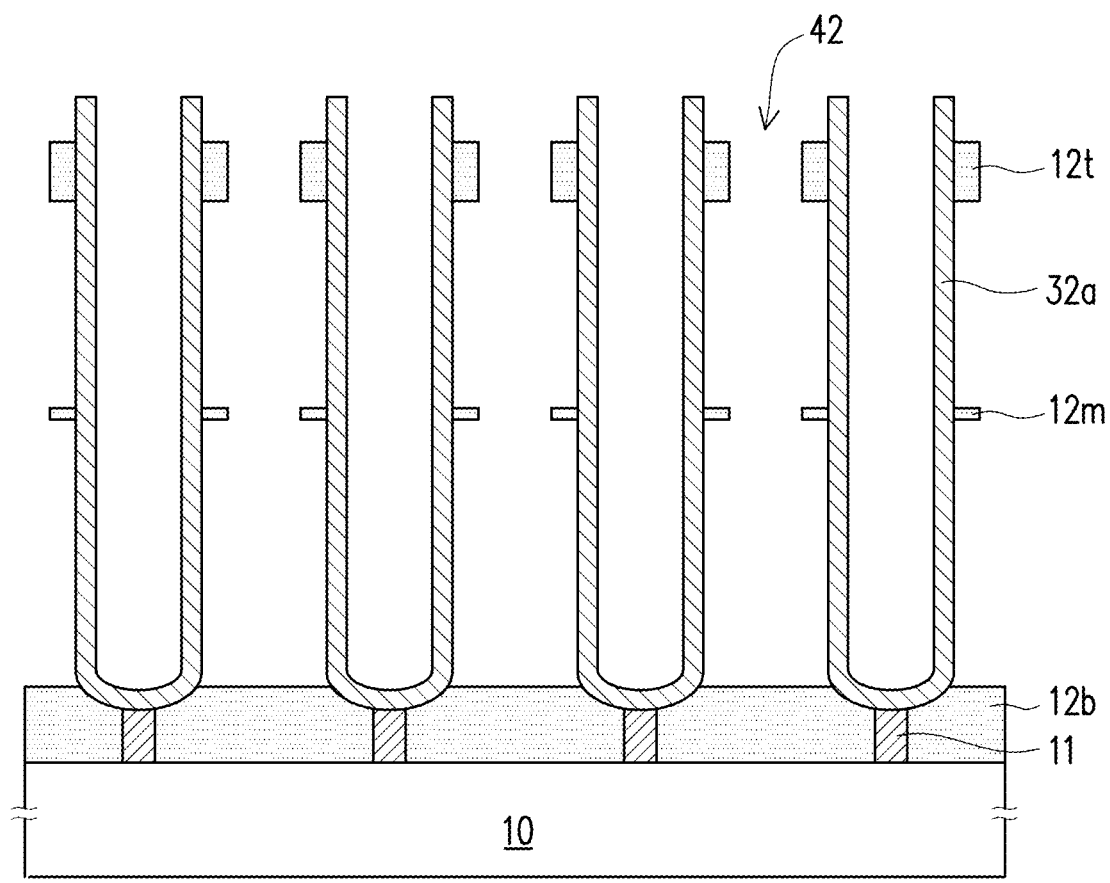

Referring to FIG. 1I, FIGS. 2D, and 3H, mold stripping is performed to remove the protective layer 36 and the template layers 14b and 14a, to expose an inner surface and an outer surface of the cup-shaped lower electrode 32a. Since materials of the protective layer 36 (for example, alumina) and the template layers 14a, 14b (for example, silicon oxide) are different from that of the support layers 12t, 12m, and 12b (for example, silicon nitride), the materials have a high etching selection ratio (for example, between 4 and 6) during etching. Therefore, the protective layer 36 and the template layers 14b and 14a may be removed through selective etching, leaving the support layers 12b, 12m, and 12t.

Referring to FIG. 2D, after mold stripping is performed, a hollowed-out structure is formed. Both the inner surface and the outer surface of the cup-shaped lower electrode 32a are exposed to effectively increase the surface area of the capacitor, thereby increasing capacitance.

Support layers 12b, 12m, and 12t support a plurality of cup-shaped lower electrodes 32a. A top surface of the support layer 12t is lower than a top surface of the cup-shaped lower electrode 32a. The support layer 12t and upper portions P1 of two adjacent cup-shaped lower electrodes form a U-shaped cross-sectional structure. The support layer 12t covers and connects upper side walls of the plurality of cup-shaped lower electrodes 32a. The support layer 12t surrounds and connects the upper portion P1 of the cup-shaped lower electrode 32a, the support layer 12m surrounds a middle portion P2 of the cup-shaped lower electrode 32a, and the support layer 12b surrounds a lower portion P3 of the cup-shaped lower electrode 32a.

Referring to FIG. 1J, FIG. 1K, FIG. 2E, and FIG. 2F, after mold stripping, a capacitive dielectric layer 44 is formed on the inner and outer surfaces of the cup-shaped lower electrode 32a and surfaces of the support layers 12t, 12m, and 12b. An upper electrode 46 is formed on a surface of the capacitive dielectric layer 44. The cup-shaped lower electrode 32a, the capacitive dielectric layer 44, and the upper electrode 46 may constitute a capacitor 50. The capacitive dielectric layer 44 includes, for example, a high-dielectric constant material layer, of which the material may be, for example, hafnium oxide (HfO), zirconia (ZrO), aluminum oxide (AlO), aluminum nitride (AlN), titanium oxide (TiO), lanthanum oxide (LaO), yttrium oxide (YO), gadolinium oxide (GdO), tantalum oxide (TaO), or a combination thereof. The material of the upper electrode 46 may include metal, metal nitride, or metal alloy, such as titanium nitride (TiN), tantalum nitride (TaN), tungsten (W), titanium tungsten (TiW), aluminum (Al), copper (Cu), or metal silicide.

Based on the above, in the disclosure, the mechanical strength of the capacitor is enhanced by using a reinforcement structure formed by the support layers, to prevent the capacitor from being deformed or even collapsing. In addition, in the embodiments of the disclosure, when the cup-shaped lower electrode is formed, a mask layer with the overhang may be used as an etch mask. In this way, not only a lithography process can be reduced, but the to-be-etched regions can be aligned accordingly, so that the accuracy of alignment can be increased. Moreover, when the cup-shaped lower electrode is formed, a chemical mechanical polishing process can be omitted, and therefore the manufacturing process can be simplified, and the manufacturing costs can be reduced. In addition, by using the cup-shaped lower electrode whose top end protrudes from the support layer and the mask layer with the overhang and the protective layer, so mold stripping can be performed without an additional photomask. Therefore, the method for manufacturing the capacitor of the disclosure can be simplified, and the manufacturing costs can be reduced.

What is claimed is:

1. A method for manufacturing a capacitor, comprising:
   sequentially forming a template layer and an upper support layer on a substrate;
   forming a first opening in the upper support layer and the template layer;
   forming a conductor layer on the substrate to cover the first opening and the upper support layer;
   forming a first mask layer on the substrate, the first mask layer comprising an overhang, covering an upper side wall of the first opening, and closing up a top end of the first opening;
   etching back the first mask layer to expose the conductor layer on the upper support layer;
   removing the conductor layer on the upper support layer to form a plurality of cup-shaped lower electrodes;
   etching back a portion of the upper support layer, so that a top end of the cup-shaped lower electrode protrudes from a top surface of the upper support layer;
   removing the first mask layer;
   forming a protective layer on the substrate;
   forming a second opening in the protective layer to expose the upper support layer;
   removing a portion of the upper support layer and a portion of the template layer below the second opening to form a third opening;
   performing mold stripping to remove the protective layer and the template layer to expose an inner surface and an outer surface of the cup-shaped lower electrode;
   forming a capacitive dielectric layer on the inner surface and the outer surface of the cup-shaped lower electrode and a surface of the upper support layer; and
   forming an upper electrode on a surface of the capacitive dielectric layer.

2. The method for manufacturing the capacitor according to claim 1, wherein forming the second opening in the protective layer comprises:
   forming a second mask layer on the protective layer, the second mask layer comprising an overhang, the overhangs on the top end of the first opening being connected to each other, and the overhangs between two adjacent cup-shaped lower electrodes being separated from each other;
   etching back the second mask layer to form a fourth opening, which exposes the upper support layer, in the second mask layer between two adjacent cup-shaped lower electrodes; and
   etching back the upper support layer exposed by the fourth opening, to form the second opening.

3. The method for manufacturing the capacitor according to claim 2, wherein a thickness of the second mask layer on the top end of the first opening is greater than a thickness of the second mask layer covering the upper support layer.

4. The method for manufacturing the capacitor according to claim 3, wherein a thickness of the first mask layer on the top end of the first opening is greater than a thickness of the first mask layer covering the conductor layer.

5. The method for manufacturing the capacitor according to claim 4, wherein the first mask layer does not fill the first opening.

6. The method for manufacturing the capacitor according to claim 2, further comprising:
   forming a lower support layer on the substrate before the template layer is formed;
   forming a middle support layer in the template layer; and removing a portion of the middle support layer when the third opening is formed.

* * * * *